United States Patent
Kasuya

(10) Patent No.: US 11,454,655 B2
(45) Date of Patent: Sep. 27, 2022

(54) CURRENT DETECTION APPARATUS

(71) Applicant: DENSO CORPORATION, Kariya (JP)

(72) Inventor: Hirokazu Kasuya, Kariya (JP)

(73) Assignee: DENSO CORPORATION, Kariya (JP)

( * ) Notice: Subject to any disclaimer, the term of this patent is extended or adjusted under 35 U.S.C. 154(b) by 58 days.

(21) Appl. No.: 17/075,236

(22) Filed: Oct. 20, 2020

(65) Prior Publication Data

US 2021/0033649 A1    Feb. 4, 2021

Related U.S. Application Data

(63) Continuation of application No. PCT/JP2019/020812, filed on May 27, 2019.

(30) Foreign Application Priority Data

Jun. 27, 2018  (JP) .............................. JP2018-122251

(51) Int. Cl.
  *G01R 19/32*  (2006.01)
  *H02P 29/68*  (2016.01)
  *G01R 15/12*  (2006.01)

(52) U.S. Cl.
  CPC ............. *G01R 19/32* (2013.01); *G01R 15/12* (2013.01); *H02P 29/68* (2016.02)

(58) Field of Classification Search
  CPC ......... G01R 19/32; G01R 15/12; H02P 29/68; H02M 1/0009; H02M 1/0012; H02M 7/44; H02H 7/00; H02H 7/20
  See application file for complete search history.

(56) References Cited

U.S. PATENT DOCUMENTS

| | | | |
|---|---|---|---|
| 10,381,913 B2* | 8/2019 | Yanai | H02M 1/08 |
| 2004/0246637 A1* | 12/2004 | Tanaka | B60G 13/14 |
| | | | 361/23 |
| 2010/0046123 A1* | 2/2010 | Fukami | H03K 17/0822 |
| | | | 361/18 |
| 2016/0065197 A1* | 3/2016 | Hsu | H03K 5/24 |
| | | | 327/77 |

FOREIGN PATENT DOCUMENTS

| | | |
|---|---|---|
| JP | 2002-290222 A | 10/2002 |
| JP | 2009-113676 A | 5/2009 |
| JP | 2011-085470 A | 4/2011 |
| JP | 2012-109912 A | 6/2012 |

* cited by examiner

*Primary Examiner* — Akm Zakaria
(74) *Attorney, Agent, or Firm* — Posz Law Group, PLC

(57) ABSTRACT

A current detection apparatus includes a voltage detector, a candidate voltage generator, a temperature detector and a correction voltage selector. The voltage detector includes an output terminal for outputting a detected voltage according to a load current. The candidate voltage generator includes correction resistors connected in series and connecting the output terminal and a ground. The candidate voltage generator generates candidate voltages at respective sections across the corresponding correction resistors. The temperature detector detects a temperature of a semiconductor switch. The correction voltage selector selects one of the candidate voltages as a corrected voltage. The one of the candidate voltages is weighted with corresponding one of the corrected magnification scales corresponding to an on-resistance of the semiconductor switch at the measured temperature. The corrected voltage indicates a corrected current value with correction of the load current according to the measured temperature.

8 Claims, 4 Drawing Sheets

CURRENT DETECTION APPARATUS

CROSS REFERENCE TO RELATED APPLICATIONS

The present application is a continuation application of International Patent Application No. PCT/JP2019/020812 filed on May 27, 2019, which designated the U.S. and claims the benefit of priority from Japanese Patent Application No. 2018-122251 filed on Jun. 27, 2018. The entire disclosures of all of the above applications are incorporated herein by reference.

TECHNICAL FIELD

The present disclosure relates to a current detection apparatus for detecting a current.

BACKGROUND

A current detection apparatus may detect the magnitude of a load current flowing through a load based on a voltage generated across terminals of a semiconductor switch disposed at a conduction path to the load.

SUMMARY

The present disclosure describes a current detection apparatus for detecting a load current flowing through a load with the adoption of a semiconductor switch disposed at an electrical conduction path to the load. The apparatus includes a voltage detector, a candidate voltage generator, a temperature detector and a correction voltage selector.

BRIEF DESCRIPTION OF DRAWINGS

The above features of the present disclosure will become more apparent from the following detailed description made with reference to the accompanying drawings. In the drawings.

DETAILED DESCRIPTION

Figure 1:
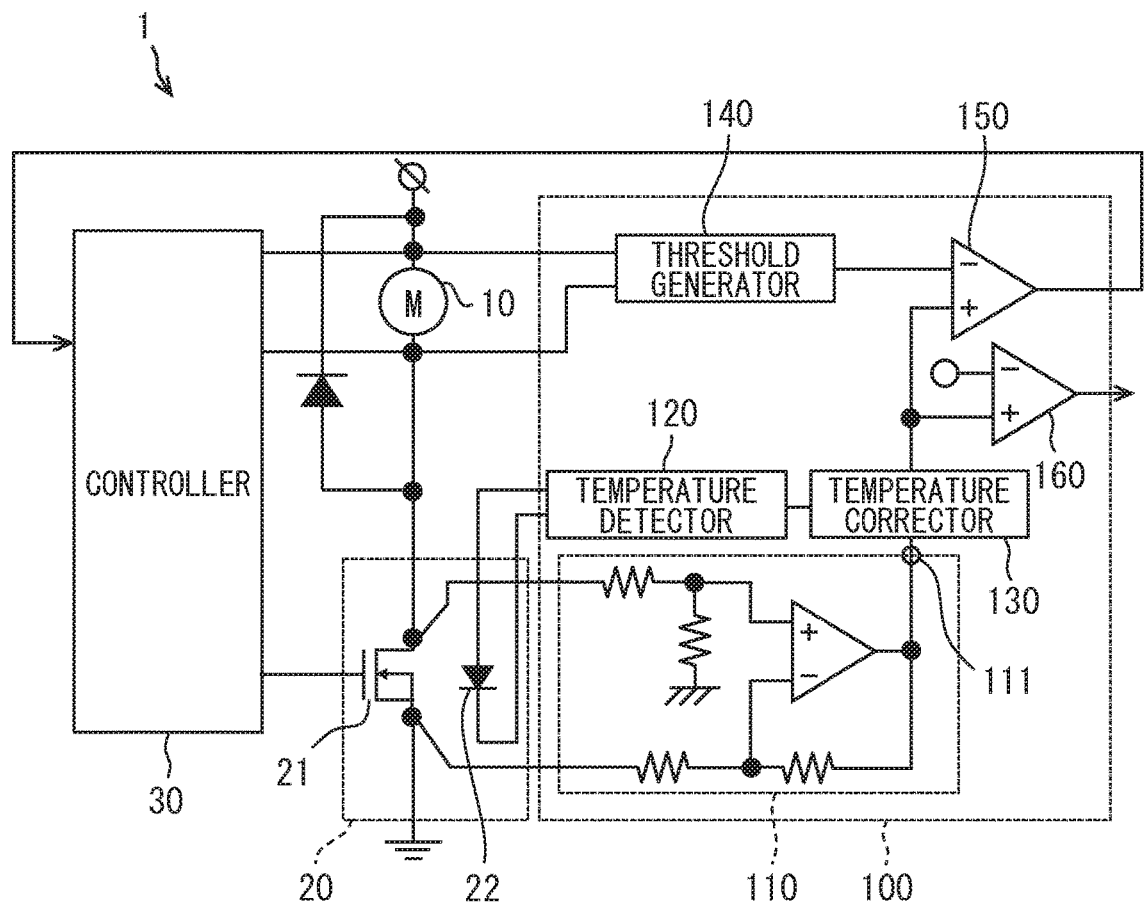
FIG. 1 illustrates the schematic configuration of a motor control system.

A current detection apparatus may include a temperature sensor and a temperature corrector for correcting temperature characteristics of the semiconductor switch, in addition to a voltage detection circuit. The voltage detection circuit may detect a measured voltage generated across the terminals of the semiconductor switch according to the load current and an on-resistance of the semiconductor switch. The temperature sensor may detect an ambient temperature around the semiconductor switch.

The temperature corrector may include an AD converter, a memory and a calculator. The AD converter may convert the measured voltage detected by the voltage detection circuit and the ambient temperature detected by the temperature sensor to digital values. The memory stores an on-resistance compensation table that compensates a change in the on-resistance of the semiconductor switch corresponding to the ambient temperature. The calculator evaluates an on-resistance compensation value based on the digital value indicative of the ambient temperature and the on-resistance compensation table.

However, in the above-mentioned current detection apparatus, a delay may occur at a change in the digital value of the measured voltage by the AD converter, in a situation where a change in the measured voltage occurs along with the fluctuation of the load current. In the above-mentioned current detection apparatus, a corrected current value based on the temperature is likely to be delayed with respect to the fluctuation of the load current.

According to an aspect of the present disclosure, a current detection apparatus adopts a semiconductor switch disposed at an electrical conduction path to a load to detect a load current flowing through the load. The current detection apparatus includes a voltage detector, a candidate voltage generator, a temperature detector, and a correction voltage selector. The voltage detector includes an output terminal that outputs a detected voltage indicating a voltage generated across terminals of the semiconductor switch according to the load current. The candidate voltage generator includes plural correction resistors connected in series and connecting the output terminal and a ground. The candidate voltage generator generates plural candidate voltages at respective sections across the corresponding correction resistors. The plural candidate voltages are respectively calculated by multiplying a plurality of correspondingly corrected magnification scales to the detected voltage. The temperature detector detects a temperature of the semiconductor switch as a measured temperature. The correction voltage selector selects one of the plural candidate voltages as a corrected voltage. The one of the candidate voltages is weighted with corresponding one of the plural corrected magnification scales corresponding to an on-resistance of the semiconductor switch at the measured temperature. The corrected voltage indicates a corrected current value with correction of the load current according to the measured temperature.

According to the above configuration, the candidate voltage generator includes plural resistors connected in series and connecting the output terminal and the ground. The candidate voltage generator generates respective candidate voltages correspondingly across the resistors. The candidate voltages are respectively obtained by multiplying plural corrected magnification scales to the detected voltage. In a situation where the measured voltage output by the voltage detector fluctuates, the candidate voltages fluctuate by maintaining the respective corrected magnification scales with respect to the measured voltage. The correction voltage selector selects a candidate voltage from the plural candidate voltages as a corrected voltage. The candidate voltage is weighted with corresponding one of the corrected magnification scales corresponding to the on-resistance at the measured temperature. The corrected current value indicated by the corrected voltage corrects temperature characteristics of the on-resistance in the semiconductor switch, without converting the detected voltage detected by the voltage detector to a digital value. Therefore, it is possible to suppress the delay of the fluctuation of the corrected current value with respect to the fluctuation of the load current.

A current detection apparatus 100 according to an embodiment of the present disclosure is adopted in a motor control system 1 as illustrated in FIG. 1. The motor control system 1 is a system that executes driving control of a motor 10. The motor control system 1 includes, for example, the motor 10, a switch chip 20, a controller 30 and the current detection apparatus 100.

The motor 10 is a driver that outputs a rotational driving force by electric power supplied from a power supply. The motor 10 controls the rotational driving force to be output according to the fluctuation of the voltage applied across the terminals. In a lock state where the rotation of the motor 10 is blocked, the load current flowing for the application of the identical voltage is larger than the unlock state.

The switch chip 20 is a semiconductor chip formed of a semiconductor substrate made of silicon or the like. The switch chip 20 is provided with a semiconductor switch 21 and a temperature sensing element 22.

The semiconductor switch 21 is a switching element adopting an n-type MOSFET or the like disposed at the switch chip 20. The semiconductor switch 21 switches the conduction state between a drain terminal and a source terminal according to a voltage level to be applied from the controller 30 to a gate terminal. The semiconductor switch 21 is disposed on a ground side, that is, a lower potential side of the motor 10 among the paths connected to the ground from the power supply, which is the electrical conduction path to the motor 10, through the motor 10. The semiconductor switch 21 blocks the electrical conduction path to the motor 10 in the off state. The semiconductor switch 21 connects the motor 10 to the ground in the on state.

The load current flowing through the motor 10 flows through the semiconductor switch that is turned on. A voltage is generated across the terminals of the semiconductor switch 21 that has been turned on, that is, between the drain terminal and the source terminal. The value of the voltage is obtained by multiplying the value of the on-resistance of the semiconductor switch 21 to the magnitude of the load current. The on-resistance of the semiconductor switch 21 rises as the temperature of the semiconductor switch 21 rises. Therefore, the generated voltage rises as the temperature rises, even though the magnitude of the load current is the same.

The temperature sensing element 22 is a semiconductor diode disposed at the switch chip 20. The temperature sensing element 22 and the semiconductor switch 21 are disposed at the switch chip 20, therefore, the temperature of the switch 20 is substantially the same as the temperature of the semiconductor switch 21. The temperature sensing element 22 generates a voltage corresponding to the temperature between the anode terminal and the cathode terminal, in a situation where a constant current flows from the anode terminal to the cathode terminal. The voltage generated in a situation of the constant current being applied decreases as the temperature rises.

The controller 30 includes an integrated circuit providing a variety of circuit elements at, for example, a semiconductor substrate. The integrated circuit included in the controller 30 has an analog circuit and a logic circuit. The controller 30 controls the driving state of the motor 10. The controller 30 switches the voltage level applied to the gate terminal of the semiconductor switch 21 to execute switchover between the on state and off state of the semiconductor switch 21. The controller 30 may change the voltage applied to the motor 10 from zero volt to the power supply voltage.

The current detection apparatus 100 includes an integrated circuit providing a variety of circuit elements at, for example, the semiconductor substrate. The integrated circuit included in the current detection apparatus 100 includes the analog circuit and the logic circuit. The current detection apparatus 100 includes a voltage detector 110, a temperature detector 120, a temperature corrector 130, a determination threshold generator 140 and a lock determinator 150.

The voltage detector 110 includes, for example, an amplifier. The voltage detector 110 is connected to the drain terminal and the source terminal of the semiconductor switch 21. The voltage detector 110 receives an input of a voltage generated according to the load current between the drain and source terminals of the semiconductor switch 21. The voltage detector 110 amplifies the input voltage at a predetermined magnification scale. The voltage detector 110 includes an output terminal for outputting the amplified voltage as a detected voltage. The detected voltage indicates the magnitude of the voltage generated between the drain and source terminals. The detected voltage is an analog signal that fluctuates continuously with the elapse of time.

Figure 2:
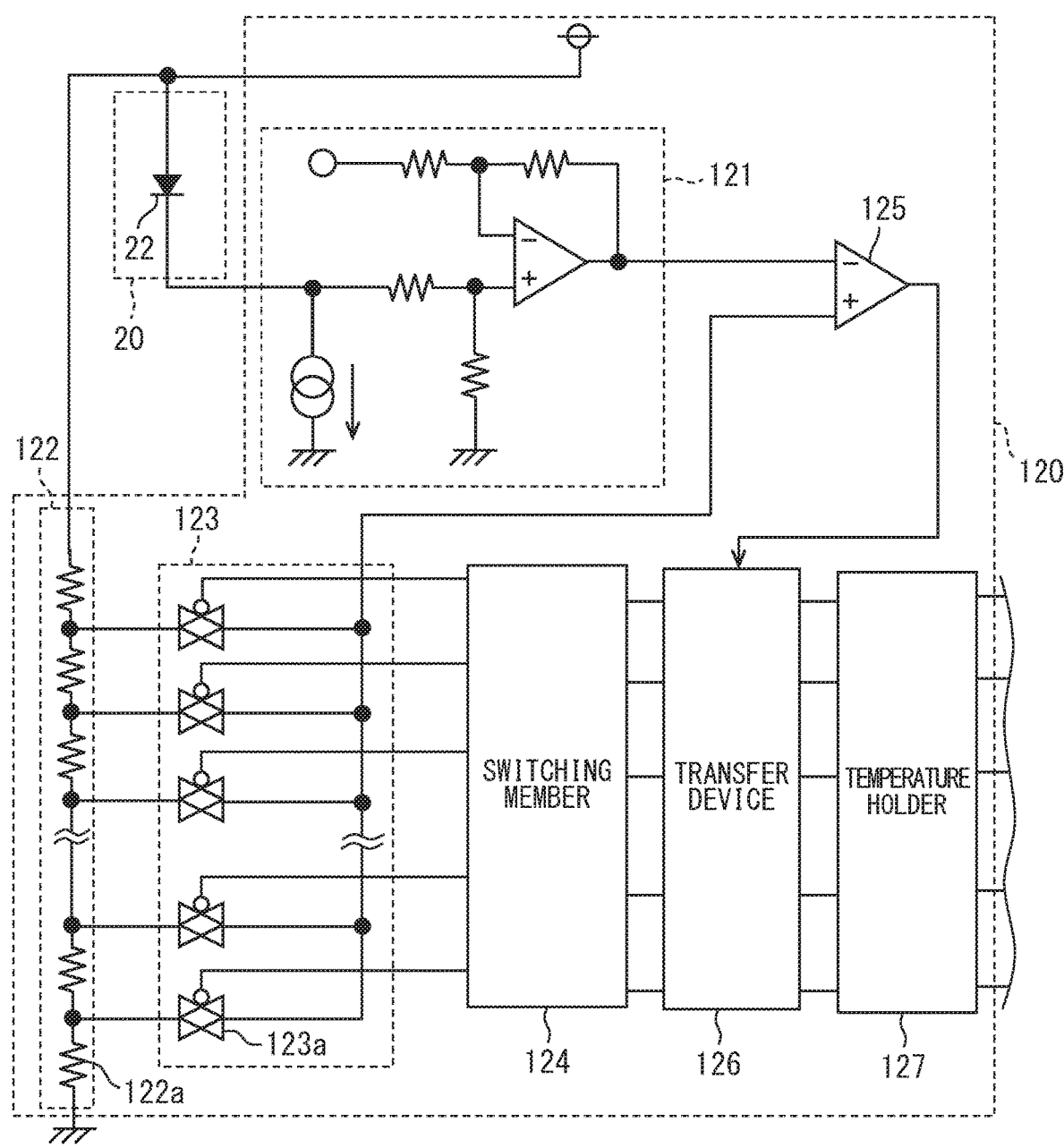
FIG. 2 illustrates the configuration of a temperature detector.

The temperature detector 120 detects the temperature of the semiconductor switch 21 as a measured temperature. The temperature detector 120 outputs a temperature zone covering the measured temperature among plural temperature zones which are preliminary set. The temperature zone according to the present embodiment is set by dividing the temperature range into several sections from 160 degrees Celsius to a lower temperature. Each of the sections is 10 degrees Celsius. The temperature detector 120 is a mixed circuit having the analog circuit and the digital circuit. The temperature detector 120 includes a temperature voltage output device 121, a temperature threshold generator 122, a temperature comparator 125 and a temperature holder 127, as illustrated in FIG. 2.

The temperature voltage output device 121, for example, includes a constant current source or an amplifier. The temperature voltage output device 121 supplies the constant current to the temperature sensing element 22 through the constant current source. The voltage of the temperature sensing element 22 at the anode terminal substantially matches the predetermined power supply voltage. The temperature voltage output device 121 receives an input of the voltage of the temperature sensing element 22 at the cathode terminal. The temperature voltage output device 121 amplifies the input voltage at a predetermined magnification scale, and outputs as the temperature voltage indicative of the temperature of the semiconductor switch 21. The voltage at the cathode terminal rises along with a decrease in the voltage generated between the anode terminal and the cathode terminal. The temperature voltage rises along with a rise in the temperature of the semiconductor switch 21.

The temperature threshold generator 122 includes plural temperature measuring resistor 122a. The plural temperature measuring resistor 122a are connected in series and are disposed in an arrangement for connecting the power supply and the ground. In the present embodiment, the temperature threshold generator 122 includes 21 temperature measuring resistors 122a. Different temperature threshold voltages with different magnitudes are generated in respective sections across corresponding temperature sensing resistors 122a. In particular, the temperature threshold voltage between the first and second temperature sensing resistors as viewed from the power supply side substantially matches the temperature voltage at a situation where the temperature of the semiconductor switch 21 is 160 degrees in Celsius. The temperature threshold voltage generated between the second and the third temperature sensing resistors as viewed from the power supply side substantially matches the temperature voltage at a situation where the temperature of the semiconductor switch 21 is 150 degrees in Celsius. In addition, with regard to the subsequent sections across the correspondingly subsequent temperature sensing resistors 122a, the temperature threshold voltage substantially matching the temperature voltage in a situation where the temperature decreases by 10 degrees in Celsius toward the ground side is generated.

The temperature threshold selector 123 includes plural comparison switch elements 123a disposed in parallel. The number of comparison switch elements 123a matches the number of temperature threshold voltages generated by the temperature threshold generator 122. Each comparison switch element 123a has a first end that is connected to any one of sections across the temperature sensing resistors 122a. Each comparison switch element 123a has a second end that is connected to the temperature comparator 125. The temperature threshold selector 123 turns on one of the comparison switch elements 123a through the switching member 124, and turns off other comparison switch elements 123a. The temperature threshold selector 123 sends the temperature threshold voltage corresponding to the comparison switch element 123a at the on state to the temperature comparator 125 as the selected temperature threshold voltage.

The switching member 124 includes, for example, a sequential circuit. The switching member 124 has an output terminal for individually switching the comparison switch element 123a between the on state and the off state. The switching member 124 periodically turns on the comparison switch element 123a based on a periodical pulse signal generated by, for example, a clock circuit. For example, the switching member 124 switches from the comparison switch element 123a corresponding to the temperature threshold voltage at a higher temperature side to the comparison switch element 123a that turns on in order to a lower temperature side for each input of the pulse signal. When the switching member 124 switches the comparison switch elements 123a to be turned on to the lowest temperature side, the switching member 124 starts switching the switch elements 123a to be turned on again from the highest temperature side to the lower temperature side. The switching member 124 switches the temperature threshold voltage selected by the temperature threshold selector 123.

The temperature comparator 125 includes, for example, a comparator. The comparator may also be referred to as a comparator circuit. The temperature comparator 125 compares the temperature voltage output from the temperature voltage output device 121 and the temperature threshold voltage selected by the temperature threshold selector 123. The temperature comparator 125 changes the output voltage level based on the comparison result. The temperature comparator 125 outputs a high level voltage in a situation where the temperature threshold voltage is larger than the temperature voltage. The temperature comparator 125 outputs a low level voltage in a situation where the temperature threshold voltage is smaller than the temperature voltage. The temperature threshold voltage input to the temperature comparator 125 through the temperature threshold selector 123 is switched in order from the higher temperature side. When the input temperature threshold voltage is switched from the higher voltage side to the lower voltage side, the voltage level output by the temperature comparator 125 is switched from the high level to the low level.

The transfer device 126 includes, for example, a sequential circuit. In a situation where the output voltage of the temperature comparator 125 is switched from the high level to the low level, the on/off state of each comparison switch element 123a set by the switching member 124 is transferred to the temperature holder 127 as the on/off state corresponding to the temperature zone. For example, in a situation where the comparison switch element 123a corresponding to 160 degrees in Celsius is turned on to switch from the high level to the low level, the on state at the temperature zone of 160 degrees to 151 degrees in Celsius is transferred, and the off state at the remainder of temperature zones is transferred.

The temperature holder 127 includes, for example, a latch circuit. The temperature holder 127 holds the on/off state of each temperature zone. When the transfer device 126 transfers the on/off state of each temperature zone, the temperature holder 127 holds individual on/off state of each temperature zone until the transfer is executed again. The temperature holder 127 has individual terminal for outputting the on/off state for each temperature zone.

Figure 3:
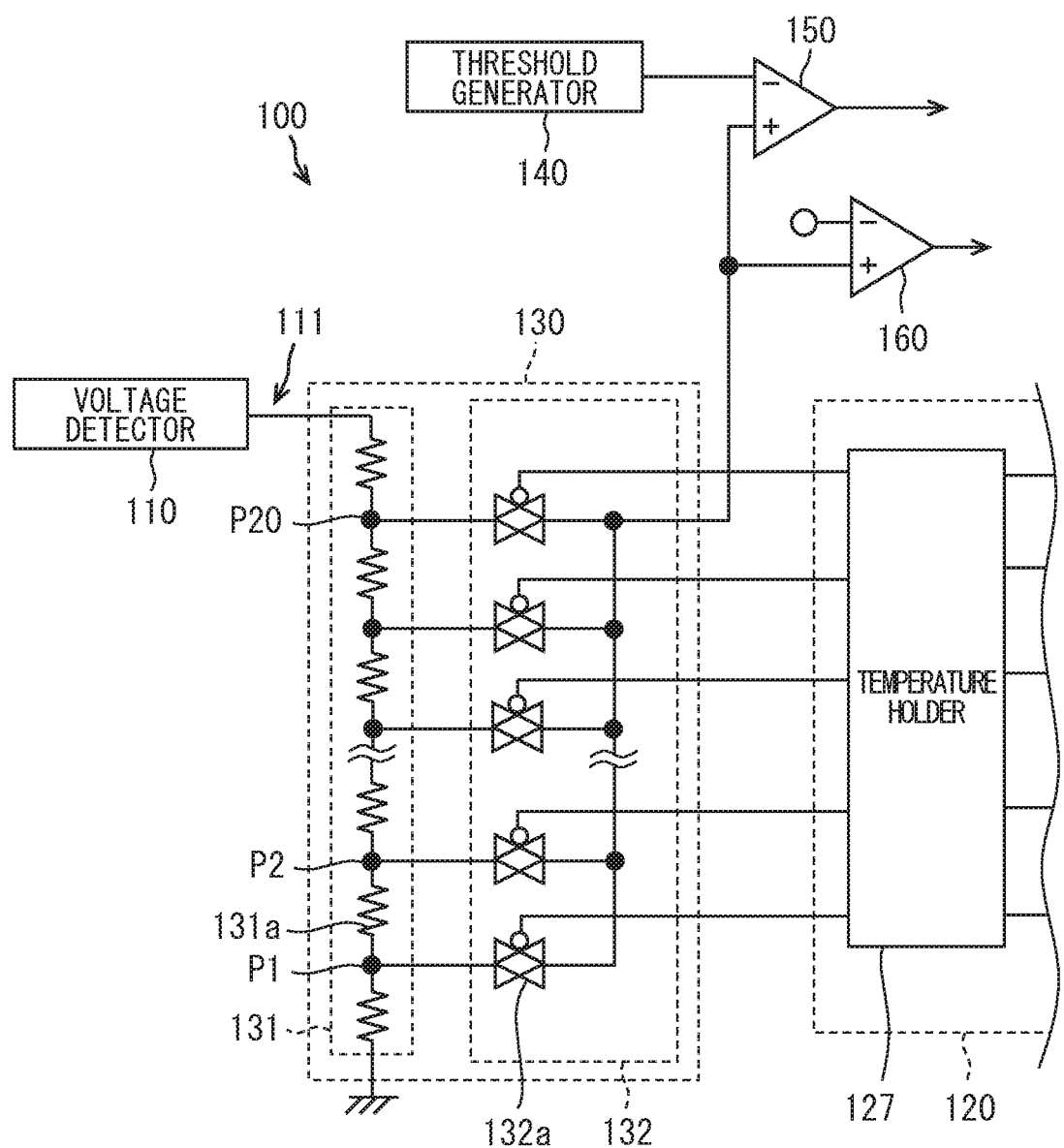
FIG. 3 illustrates the configuration of a temperature corrector.

The temperature corrector 130 corrects the detected voltage based on the measured temperature detected by the temperature detector 120. In particular, the detected voltage is corrected according to the on/off state of each temperature zone output from the temperature holder 127. The temperature corrector 130 includes a candidate voltage generator 131 and a correction voltage selector 132, as illustrated in FIG. 3.

The candidate voltage generator 131 includes plural correction resistors 131a. The plural correction resistors 131a are connected in series, and connect the output terminal 111 of the voltage detector 110 and the ground. In the present embodiment, the candidate voltage generator 131 includes 21 correction resistors 131a. The candidate voltage is generated at wiring located at each section across the corresponding correction resistors 131a. The candidate voltage is obtained by multiplying a corrected magnification scale with a distinct magnitude to the detected voltage output by the output terminal. In other words, each candidate voltage is weighted with a distinct corrected magnification scale. Each candidate voltage is an analog signal changing continuously along with a continuous change in the detected voltage.

The corrected magnification scale at each position is a magnitude obtained through dividing the sum of resistance values of the correction resistors 131a at the ground side from the position by the sum of the resistance values of all correction resistors 131a between the output terminal 111 and the ground. The corrected magnification scale at the position P1 between the first and second correction resistors 131a as viewed from the ground side is the corrected magnification scale at the temperature zone from 160 to 150 degrees in Celsius. The corrected magnification scale at the position P2 between the second and third correction resistors 131a as viewed from the ground side is the corrected magnification scale at the temperature zone from 150 to 141 degrees in Celsius. The corrected magnification scales respectively at different positions across the correction resistors 131a are the corrected magnification scales in the temperature zones with lower temperature in order toward the output terminal 111 side. The corrected magnification scale at the position P20 between the 20th and 21st correction resistors 131a as viewed from the ground side is the corrected magnification scale at the temperature zone from minus 30 to minus 39 degrees in Celsius.

Figure 4:
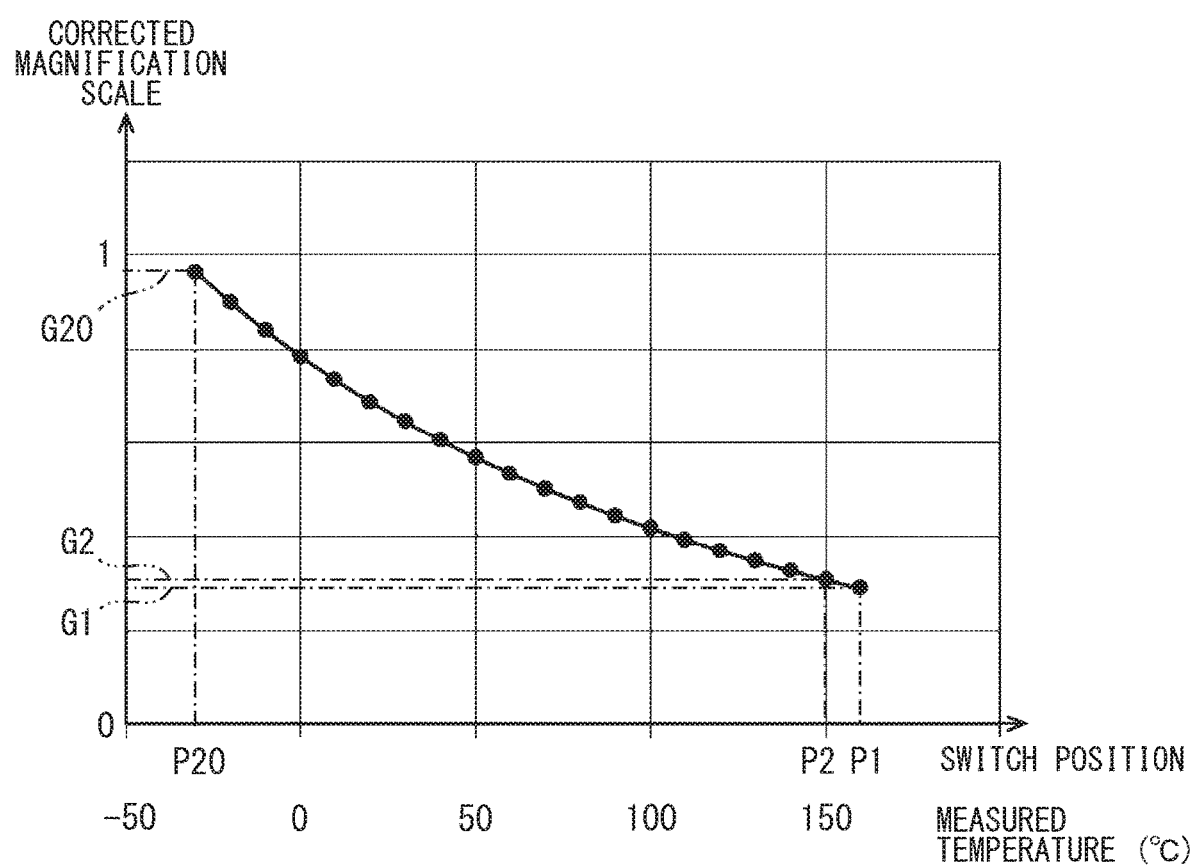
FIG. 4 illustrates the relationship between a detected temperature and a corrected magnification scale.

As illustrated in FIG. 4, each corrected magnification scale is set as a reference value (or mapping) having a smaller value corresponding to the corrected magnification scale corresponding to the temperature zone at the higher temperature side. The corrected magnification scale at each temperature zone is set according to the reciprocal of the on-resistance value in the temperature zone. For example, the gain G1, which is the corrected magnification scale in the temperature zone from 160 to 151 degrees in Celsius, is set according to the reciprocal of the on-resistance value at 160 degrees in Celsius included in the temperature zone. The gain G2, which is the corrected magnification scale in the temperature zone from 150 to 141 degrees in Celsius, is set according to the reciprocal of the on-resistance value at 150 degrees in Celsius. Similarly, the corrected magnification scale for each subsequent temperature zone is set according to the reciprocal of the on-resistance value at every 10-degree in Celsius range. The gain G20, which is the corrected magnification scale in the temperature zone from minus 30 to minus 39 degrees in Celsius, is set according to the reciprocal of the on-resistance value at minus 30 degrees in Celsius. By setting the corrected magnification according to mapping reference, it is possible to suppress the occurrence of an error in the correction at the temperature zone and correct the detected voltage, as compared with the setting of the corrected magnification scale according to the approximate straight line.

The correction voltage selector 132 includes plural switch elements 132a disposed in parallel as illustrated in FIG. 3. In the present embodiment, the correction voltage selector 132 includes 20 correction switch elements 132a. Each correction switch element 132a has a first end connected between the correction resistor 131a and the adjacent correction resistor 131a included in the candidate voltage generator 131. Each correction switch element 132a has a second end connected to the lock determinator 150 and a short circuit determinator 160. The correction voltage selector 132 turns on only one correction switching element 132a among plural switching element 132a, and turns off the remainder of the correction switching elements 132a. The correction switch element 132a to be turned on is selected according to: (i) the temperature zone where the on state is held by the temperature holder 127 and (ii) the corrected magnification scale at the position of the connected candidate voltage generator 131.

In particular, in a situation where the on state is held in the temperature zone from 160 to 151 degrees in Celsius, the correction switch element 132a connected to the position between the first and second correction resistors 131a as viewed from the ground side is turned on. The correction switch element 132a to be turned on moves to the output terminal 111 side as the temperature zone in which the on state is held moves to the lower temperature side. When the on state is held in the temperature zone from minus 30 to minus 39 degrees in Celsius, the correction switch element 132a connected to the position P20 is turned on. The correction voltage selector 132 selects a candidate voltage among plural candidate voltages having a corrected magnification scale corresponding to the on-resistance in the temperature zone covering the measured temperature, as the corrected voltage. The selected corrected voltage has a magnitude that indicates the corrected current value as the magnitude of the load current corrected according to the measured temperature. Since the corrected voltage is selected from plural candidate voltages, the corrected voltage is also an analog signal. The correction voltage selector 132 sends the selected corrected voltage to the lock determinator 150 and the short circuit determinator 160.

The determination threshold generator 140 includes, for example, an amplifier circuit. The determination threshold generator 140 receives the voltage generated across the terminals of the motor 10. The determination threshold generator 140 generates the lock threshold voltage by amplifying the input voltage at a preset magnification scale. The magnitude of the lock threshold voltage is set to the corrected voltage corresponding to the lock current as the load current flowing in a situation where the motor is in the lock state. The lock threshold voltage increases as the input voltage across the terminals of the motor 10 increases. The lock threshold voltage is output as an analog signal.

The lock determinator 150 includes, for example, a comparator circuit. The lock determinator 150 compares the corrected voltage with the lock threshold voltage through the comparator circuit. The corrected voltage is an analog signal selected by the correction voltage selector 132. The lock threshold voltage is an analog signal output from the determination threshold generator 140. The lock determinator 150 outputs a lock determination signal to the controller 30 in a situation where the corrected voltage is larger than the lock threshold voltage. The lock determination signal indicates that the motor 10 is in the lock state. For example, the lock current of the motor may be an increased current when the rotation is interrupted with respect to a steady current when the rotation is executed normally. Since the lock current is determined by the inverter output applied to the motor, a variable determination threshold is required instead of a fixed value in order to detect the lock current.

The short circuit determinator 160 includes, for example, a comparator circuit. The short circuit determinator 160 compares the corrected voltage with the preset short circuit threshold voltage. The short circuit threshold voltage is set to the corrected voltage corresponding to the load current in a situation where the motor 10 is short-circuited. The short circuit determinator 160 outputs a short circuit signal in a situation where the corrected voltage is larger than the short circuit threshold voltage. The short circuit signal indicates that the motor 10 is in a short-circuit state.

According to the above-mentioned embodiment, the candidate voltage generator 131 includes plural correction resistors 131a connected in series and connecting the output terminal 111 and the ground. The candidate voltage generator 131 generates the respective candidate voltages across the correction resistors 131a. The candidate voltages are respectively obtained by multiplying plural corrected magnification scales to the detected voltages. When the detected voltage output from the voltage detector 110 fluctuates, each candidate voltage fluctuates while maintaining each corrected magnification scale corresponding to the detected voltage. The correction voltage selector 132 selects a candidate voltage from plural candidate voltages as the corrected voltage. The candidate voltage has the corrected magnification scale corresponding to the on-resistance at the measured temperature. The corrected current value indicated by the corrected voltage corrects the temperature characteristics of the on-resistance of the semiconductor switch 21 without converting the detected voltage detected by the voltage detector 110 to the digital value. It is possible for the current detection apparatus 100 to suppress the delay of the corrected current value with respect to the fluctuation of the load current caused by, for example, the sampling cycle of the conversion to the digital value.

Additionally, the lock determinator 150 determines whether or not the motor 10 is in the lock state, based on the corrected voltage indicative of the corrected current value. It is possible for the current detection apparatus 100 to suppress the determination of the lock state executed by the lock determinator 150, in a situation where the load current increases due to the motor 10 being in the lock state.

The lock determinator 150 compares the corrected voltage and the lock threshold voltage through the comparator circuit. According to the above configuration, the lock determinator 150 can determine the lock state without converting the detected voltage and the corrected voltage into digital values. Therefore, it is possible to suppress the delay of determining the lock state in the current detection apparatus 100.

The motor 10 corresponds to a load.

OTHER EMBODIMENTS

While the embodiments of the present disclosure are described above, the present disclosure is not limited to the embodiments described above. The following modifications are included in the technical scope of the present disclosure, and various changes other than the following may be made without departing from the essence of the present disclosure. In the following description, elements having the same reference numerals as those used so far are the same as elements having the same reference numerals in the previous embodiments, except when specifically described. When only a part of the configuration is described, the embodiment described above can be applied to other parts of the configuration.

In the above embodiment, the semiconductor switch 21 is disposed at the low potential side of the motor 10 in the electrical conduction path to the motor 10. The semiconductor switch 21 may be disposed at the power supply side, in other words, the high potential side of the motor 10 in the electrical conduction path to the motor 10.

In the above embodiment, n-type MOSFET is adopted as the semiconductor switch 21. However, other switch elements made of a semiconductor such as p-type MOSFET or IGBT may be adopted.

In the above embodiment, the elements included in the current detection apparatus 100 are integrated at a single semiconductor substrate. However, the current detection apparatus may be divided into plural semiconductor substrates and then integrated. Alternatively, at least a part of the current detection apparatus 100 may be configured by discrete components. The current detection apparatus 100 may be integrated at a single semiconductor substrate including the controller 30.

In the above embodiment, the temperature detector 120 is configured by a circuit having an analog circuit and a logic circuit. However, the temperature detector 120 may be configured by a digital circuit having, for example, an AD converter and plural logic circuits.

In the above embodiment, the corrected voltage selected by the correction voltage selector 132 is adopted for the determination of overcurrent caused by the lock state and short circuit state of the motor 10. However, the corrected voltage may not only be applied to this situation. For example, the corrected voltage may be adopted for only determining the lock state. The corrected voltage may be adopted for feedback control or the like in which the magnitude of the voltage applied to the motor 10 is changed according to the magnitude of the load current. In the above embodiment, the motor 10 is provided as the load. However, the load may not be limited to the motor.

In the above embodiment, the temperature corrector 130 sets and selects the corrected magnification scale for each temperature zone, which is obtained by dividing the range of minus 39 degrees to 160 degrees in Celsius into several zones or sections having equal widths of every 10 degrees in Celsius. However, the temperature range and temperature zone may be modified as appropriate. For example, in the semiconductor switch 21, the width of the temperature zone may be set narrower in the temperature zone having higher frequency and wider in the temperature zone having lower frequency. The width of the temperature zone may set narrower in the temperature zone having a large fluctuation of the corrected magnification scale relative to the fluctuation of temperature, and may be set wider in the temperature zone having smaller fluctuation of the corrected magnification scale relative to the fluctuation of temperature. According to such setting, it is possible to improve the accuracy of the corrected voltage while simplifying the respective configurations of the temperature detector 120 and the temperature corrector 130.

In the above embodiment, one semiconductor diode is provided for the switch chip 20 as the temperature sensing element 22 for temperature detection in the temperature detector 120. However, the arrangement and configuration of the temperature sensing element 22 may not only be limited to this situation. For example, the temperature sensing element 22 may be disposed at a position at the vicinity of the switch chip 20. Plural semiconductor diodes connected in series may be adopted as the temperature sensing element 22. Other types of elements having temperature characteristics may also be adopted as the temperature sensing element 22.

What is claimed is:

1. A current detection apparatus adopting a semiconductor switch disposed at an electrical conduction path to a load to detect a load current flowing through the load, the current detection apparatus comprising:
    a voltage detector including an output terminal configured to output a detected voltage indicating a voltage generated across terminals of the semiconductor switch according to the load current;
    a candidate voltage generator including a plurality of correction resistors connected in series and connecting the output terminal and a ground, the candidate voltage generator configured to generate a plurality of candidate voltages at respective sections across the corresponding correction resistors, the plurality of candidate voltages respectively calculated by multiplying a plurality of corrected magnification scales to the detected voltage;
    a temperature detector configured to detect a temperature of the semiconductor switch as a measured temperature; and
    a correction voltage selector including a plurality of switches respectively connected to the correction resistors, and configured to select one of the plurality of candidate voltages as a corrected voltage by turning on only a corresponding one of the switches and turning off all of the remaining switches, the one of the plurality of candidate voltages weighted with corresponding one of the plurality of corrected magnification scales corresponding to an on-resistance of the semiconductor switch at the measured temperature, the corrected voltage indicating a corrected current value with correction of the load current according to the measured temperature,
    wherein each of the corrected magnification scales is a magnitude acquired through dividing a first value by a second value,
    wherein the first value is a total resistance of one or more of the correction resistors connected in series from a position at a corresponding one of the respective sections to a ground side, and
    wherein the second value is a total resistance of all of the correction resistors connected in series from the output terminal to the ground side.

2. The current detection apparatus according to claim 1, wherein the load is a motor, the current detection apparatus further comprising:
- a determination threshold generator including an amplifier circuit, and configured to generate a lock threshold voltage indicating a lock current flowing in a situation where the motor is in a lock state, based on a voltage generated across terminals of the motor and applied to the amplifier circuit; and
- a lock determinator configured to determine that the motor is in the lock state, in response to that the corrected voltage is equal to or larger than the lock threshold voltage, and wherein the lock determinator includes a comparator configured to compare the corrected voltage with the lock threshold voltage.

3. The current detection apparatus according to claim 1, wherein the temperature detector includes a latch circuit configured to store the measured temperature corresponding to the on-resistance of the semiconductor switch to turn on the only corresponding one of the switches and turn off the remaining all of the switches according to the measured temperature.

4. The current detection apparatus according to claim 1, wherein the correction voltage selector is configured to select one of the plurality of candidate voltages as a corrected voltage by turning on only a corresponding one of the switches and turning off all of the remaining switches based on the measured temperature.

5. A current detection apparatus adopting a semiconductor switch disposed at an electrical conduction path to a load to detect a load current flowing through the load, the current detection apparatus comprising:
- a voltage detector including an output terminal configured to output a detected voltage indicating a voltage generated across terminals of the semiconductor switch according to the load current;
- a voltage divider including a plurality of correction resistors connected in series and connecting the output terminal and a ground, the voltage divider configured to generate a plurality of candidate voltages at respective sections across the corresponding correction resistors, the plurality of candidate voltages respectively calculated by multiplying a plurality of corrected magnification scales to the detected voltage;
- a temperature detector configured to detect a temperature of the semiconductor switch as a measured temperature; and
- a correction voltage selector including a plurality of switches respectively connected to the correction resistors, and configured to select one of the plurality of candidate voltages as a corrected voltage by turning on only a corresponding one of the switches and turning off all of the remaining switches, the one of the plurality of candidate voltages weighted with corresponding one of the plurality of corrected magnification scales corresponding to an on-resistance of the semiconductor switch at the measured temperature, the corrected voltage indicating a corrected current value with correction of the load current according to the measured temperature, wherein each of the corrected magnification scales is a magnitude acquired through dividing a first value by a second value, wherein the first value is a total resistance of one or more of the correction resistors connected in series from a position at a corresponding one of the respective sections to a ground side, and wherein the second value is a total resistance of all of the correction resistors connected in series from the output terminal to the ground side.

6. The current detection apparatus according to claim 5, wherein the load is a motor, the current detection apparatus further comprising:
- a determination threshold generator including an amplifier circuit, and configured to generate a lock threshold voltage indicating a lock current flowing in a situation where the motor is in a lock state, based on a voltage generated across terminals of the motor and applied to the amplifier circuit; and
- a lock determinator configured to determine that the motor is in the lock state, in response to that the corrected voltage is equal to or larger than the lock threshold voltage, and wherein the lock determinator includes a comparator configured to compare the corrected voltage with the lock threshold voltage.

7. The current detection apparatus according to claim 1, wherein the temperature detector includes a latch circuit configured to store the measured temperature corresponding to the on-resistance of the semiconductor switch to turn on the only corresponding one of the switches and turn off the remaining all of the switches according to the measured temperature.

8. The current detection apparatus according to claim 1, wherein the correction voltage selector is configured to select one of the plurality of candidate voltages as a corrected voltage by turning on only a corresponding one of the switches and turning off all of the remaining switches based on the measured temperature.

* * * * *